United States Patent [19]

Mahalla

[11] 4,192,695
[45] * Mar. 11, 1980

[54] METAL CRYSTALS AND PROCESS

[76] Inventor: Shalom Mahalla, P.O. Box 11183, Phoenix, Ariz. 85012

[*] Notice: The portion of the term of this patent subsequent to Apr. 25, 1995, has been disclaimed.

[21] Appl. No.: 898,799

[22] Filed: Apr. 24, 1978

Related U.S. Application Data

[63] Continuation-in-part of Ser. No. 677,690, Apr. 16, 1976, Pat. No. 4,086,082.

[51] Int. Cl.$^2$ ............... C22B 9/08; C22B 13/00; C22B 25/00; C22B 30/00
[52] U.S. Cl. ............... 148/32; 75/0.5 A; 75/0.5 AB; 75/108
[58] Field of Search ......... 75/0.5 A, 0.5 AA, 0.5 AB, 75/0.5 AC, 0.5 B, 0.5 BA, 0.5 BB, 0.5 BC, 108, 109, 251, 252, 253, 254, 255; 204/10; 148/31, 32; 423/87

[56] References Cited

U.S. PATENT DOCUMENTS

| | | | |
|---|---|---|---|
| 2,481,079 | 9/1949 | Casey | 75/0.5 B |
| 2,913,333 | 11/1959 | Eaton et al. | 75/0.5 A |
| 2,967,102 | 1/1961 | Vaughan | 75/84.1 R |
| 2,969,413 | 1/1961 | Peters | 204/10 |
| 3,383,401 | 5/1968 | Woods et al. | 75/109 |
| 3,419,901 | 12/1968 | Nordblom | 204/10 |
| 3,499,756 | 3/1970 | Fitzhugh, Jr. et al. | 75/109 |
| 3,684,480 | 8/1972 | Louzos | 204/10 |
| 3,690,866 | 9/1972 | Louzos | 75/0.5 A |
| 3,694,185 | 9/1972 | Kunda et al. | 75/0.5 AB |
| 3,748,106 | 7/1973 | Davis et al. | 75/251 |
| 3,992,197 | 11/1976 | Wetzold | 75/0.5 A |

FOREIGN PATENT DOCUMENTS

| | | | |
|---|---|---|---|
| 38-11853 | 11/1963 | Japan | 75/251 |
| 46-34489 | 10/1971 | Japan | 75/0.5 B |

*Primary Examiner*—L. Dewayne Rutledge
*Assistant Examiner*—Michael L. Lewis
*Attorney, Agent, or Firm*—William H. Drummond

[57] ABSTRACT

A new article of manufacture consisting of a metal crystal which is macrocrystalline, unicrystalline and columnar. The crystal consists of a single prime particle bounded by at least two sets of distinguishable (hkl) planes specific to the metal which are determined by the internal crystal structure. The crystal orientation is such that another (hkl) plane specific to the metal is perpendicular to the long axis of the crystal. The sets of planes define a plurality of parallel, non-coplanar macroscopic facets, which microscopically are crystallographic step-growth surfaces.

A process for producing a product metal from a solution of metal values is disclosed. Crystals of the product metal in a pregnant solution of the metal values are supplied with electrons to preferentially reduce product metal ions in the locus of the crystals to product metal. Positive ions are supplied in a region of the crystallization zone remote from the locus of reduction of the metal ions to maintain ionic charge neutrality in the pregnant solution. A concentration step-function of the metal values is established in the locus of the crystals, the gradient thereof being at least sufficient to cause the product metal to attach to the crystal lattice of the crystals by atomic bonding.

7 Claims, 1 Drawing Figure

METAL CRYSTALS AND PROCESS

This application is a continuation-in-part of my co-pending application Ser. No. 677,690, filed Apr. 16, 1976, entitled "Copper Crystal and Process", now U.S. Pat. No. 4,086,082, granted on Apr. 25, 1978, the specification and drawings of which are incorporated herein by reference.

This invention concerns novel articles of manufacture consisting of metal crystals having unique characteristics.

In another respect, the invention relates to a novel process for manufacturing metal crystals.

In still another aspect, the invention concerns novel processes for winning metal values from solutions thereof.

In a further respect, the invention relates to novel metal crystals which are produced by entirely hydrometallurgical means from solutions containing metal values.

I have now discovered and invented new articles of manufacture consisting of crystals of a product metal which are macrocrystalline, unicrystalline and columnar and consisting of a single prime particle bounded by at least two sets of distinguishable (hkl) planes specific to the metal which are determined by the internal crystal structure. The crystal orientation is such that another (hkl) plane specific to the metal is perpendicular to the long axis of the crystal. The sets of planes define a plurality of parallel, non-coplanar, macroscopic facets which microscopically are crystallographic step-growth surfaces.

In the novel columnar metal crystals of the invention, the plane which is perpendicular to the long axis of the crystal is a plane of maximum atomic packing having minimum surface energy and the bounding planes are planes of higher surface energy but having low Miller indices, i.e., combinations of ones and zeroes.

For example, in the novel columnar crystals of copper, the bounding planes are (100) planes, a (110) plane is perpendicular to the long axis of the crystal and a (111) plane is perpendicular to the smallest cross-section of the crystal. The novel columnar crystals of silver and nickel have the same configuration as the copper crystal. In the tin crystals of the invention, the bounding planes are (100) planes, the plane perpendicular to the long axis of the crystal is a (001) plane and the plane perpendicular to the smallest cross-section is a (110) plane. Tantalum crystals of the invention have bounding planes which are (110) planes, a (111) plane is perpendicular to the long axis of the crystal and a (110) plane is perpendicular to the smallest cross-section thereof.

As used herein, the term "macrocrystalline" means distinguishable with the naked eye. In fact, by proper adjustment of process parameters, one can easily manufacture crystals visible to the naked eye, reaching lengths of up to three inches or more with cross-sectional dimensions of ¼ inch or greater.

The term "unicrystalline", as used herein, means that the article of manufacture is a single crystal. As will be described below, the process produces macrocrystals, at least some of which are unicrystalline, with the remainder consisting of only two or three single macrocrystals joined at a grain boundary.

The term "columnar", as used herein, means that the crystal is elongate, as distinguished from an equiaxed crystal or a chill crystal.

It is possible to grow copper and other metal crystals which are macrocrystalline, unicrystalline and columnar under very carefully controlled laboratory conditions. Thus, a melt of extremely pure copper in a mold can be seeded with a microcrystal and then gradually cooled along the long axis of the mold such that a single columnar macrocrystal is produced. The external morphology of such a crystal will, however, be dictated by the shape of the mold cavity rather than by the internal crystal microstructure. By contrast, however, the new article of manufacture disclosed herein is a single prime particle bounded by at least two sets of distinguishable planes which are determined by, and in fact dictated by, the internal crystal structure. In the novel crystals of the invention, the bounding planes are (hkl) planes specific to the particular metal in question with another (hkl) plane specific to the particular metal in question perpendicular to the long axis of the crystal.

Further, these sets of bounding planes define facets which are parallel and non-coplanar and lie in crystallographic step-growth surfaces. Thus, the crystals of the present invention are distinguishable from a molded single columnar macrocrystal manufactured by the laboratory technique even if the laboratory mold is configured to provide the (hkl) planar boundaries described above, because the external morphology of the molded crystal is not determined by the internal crystal microstructure and the external surfaces of the molded crystal are not crystallographic step-growth surfaces.

The metal crystals of the present invention are useful after any desired conventional machining, casting or other forming techniques for any known uses of the particular metal in question, especially where high purity yields advantageous mechanical or electrical properties.

In addition to the metal crystals which are novel articles of manufacture described above, I have invented and discovered processes and methods for winning various product metals from solutions of metal values, including copper values. The method and process, considered in its broadest aspects, provide a technique for manufacturing crystals of a product metal and includes the steps of providing in a crystallization zone a pregnant solution of values of the product metal and crystals of the product metal, supplying electrons to the crystals to preferentially reduce product metal ions to product metal in a reduction zone adjacent the crystals, supplying positive ions in a region of the crystallization zone remote from the reduction zone to maintain ionic charge neutrality in the solution, and establishing a concentration step-function of the metal values in the crystallization zone in the locus of the crystals, the gradient thereof being at least sufficient to cause the product metal to attach to the crystal lattice of the crystals by atomic bonding.

As indicated above, the method and process of the invention is applicable to winning various product metals from solutions thereof, in particular for manufacturing crystals of the product metal. In this connection, a description follows which is generally applicable to the manufacture of any of the suitable product metals. This description will then be followed by a more detailed description of the presently preferred embodiments of the invention which involve the manufacture of several specific novel metal crystals.

To manufacture the novel metal crystals of the invention, one must first provide a pregnant solution of values of the product metal. This pregnant solution preferably consists of an aqueous solution of a soluble compound of the product metal (MeX), the solubilized compound being dissociated as a metal cation (Me+) and a corresponding anion (X−). The metal moiety of the product metal compound can be chosen from among any of the metals which form soluble salts and which, in their solid elemental states (Me°), exist as crystals, i.e., a regular polyhedral form which is assumed by the metal under the action of its interatomic forces. The crystals are characterized first by a definite internal crystallographic structure and, second, by its external form. As will be further described below, the mechanism of my process appears to involve an anion transport mechanism and, consequently, it is preferred to employ a soluble compound of the metal having a relatively small anion such as, for example, Cl−.

The concentration of the metal values in the pregnant solution is not highly critical so long as one maintains a minimum concentration, specific to the metal in question. If the metal concentration in the pregnant solution is lower than this minimum concentration, the metal ions which are reduced in the reduction zone will not attach to the crystal lattice by atomic bonding and the product of the process will not be the desired crystals but, rather, will consist of particles or flakes of the product metal. The minimum concentration of metal values necessary to insure production of the desired product metal crystals will vary with the specific metal, and other process conditions including pH, temperature, the method of supplying electrons and positive ions, etc. However, such minimum concentration can be readily determined by one ordinarily skilled in the art, having regard for the disclosure hereof, by routine experimentation, observing the nature of the product metal produced, i.e., crystals versus particles or flakes.

The pregnant solution of metal values is provided in a crystallization zone along with crystals of the product metal. The product metal crystals are formed in situ by the technique described in my U.S. Pat. No. 4,086,082 by contacting the pregnant solution with a reagent metal higher in the EMF series than the product metal, causing a so-called "displacement" reaction in which the product metal ions are reduced to the Me° state, forming the crystals and the sacrificial reagent metal is oxidized and goes into solution as its positive ion. Simultaneously, as the product metal ions are reduced, the pregnant solution is impoverished in the Me+ ions, establishing a very steep concentration gradient (herein called "step function") in the pregnant solution. As the product metal deposited by the displacement reaction grows away from the reagent metal, maintaining its electrical contact therewith, the displacement reaction supplies electrons to the growing crystal which reduce more Me+ ions in a reduction zone located adjacent the growing tip of the crystal. Simultaneously, positive ions of the sacrificial reagent metal are supplied to the mother liquor at a point remote from the reduction zone, thus maintaining overall ionic charge neutrality in the solution.

As the columnar crystals of the product metal grow away from the reagent metal, toward the region of higher product metal ion concentration in the pregnant solution, the concentration step function originally established in the region of the reagent metal is autogenously maintained and moves with the tip of the growing crystal toward the region of the highest product metal ion concentration. The growing crystals are maintained in electrical contact with the reagent metal such that electrons are continually supplied to the tip of the crystal in the region of the concentration step function to reduce product metal ions to product metal in this reduction zone. Correspondingly, the reagent metal is oxidized and continuously supplies positive ions in a region of the crystallization zone which is remote from the reduction zone.

DESCRIPTION OF THE DRAWING

Thus, the process described above and in my issued patent can thus be viewed as a plurality of discrete steps. This is shown schematically in FIG. 1. Crystals of the product metal 1 and a pregnant solution of the metal values 2 are contacted. Electrons 3 are supplied to the metal crystals 1 to reduce the metal values (Me+) of the pregnant solution and positive ions 4 are supplied to the solution to maintain ionic charge neutrality. The result is the establishment of the Me+ concentration step function 5, causing the reduced metal ions (Me°) to attach to the metal crystals 1 by atomic bonding to produce the desired Me° crystals 6.

The following examples are presented in order to illustrate the presently preferred practice of the invention by reference to the production of crystals of several representative metals.

Figure 1:
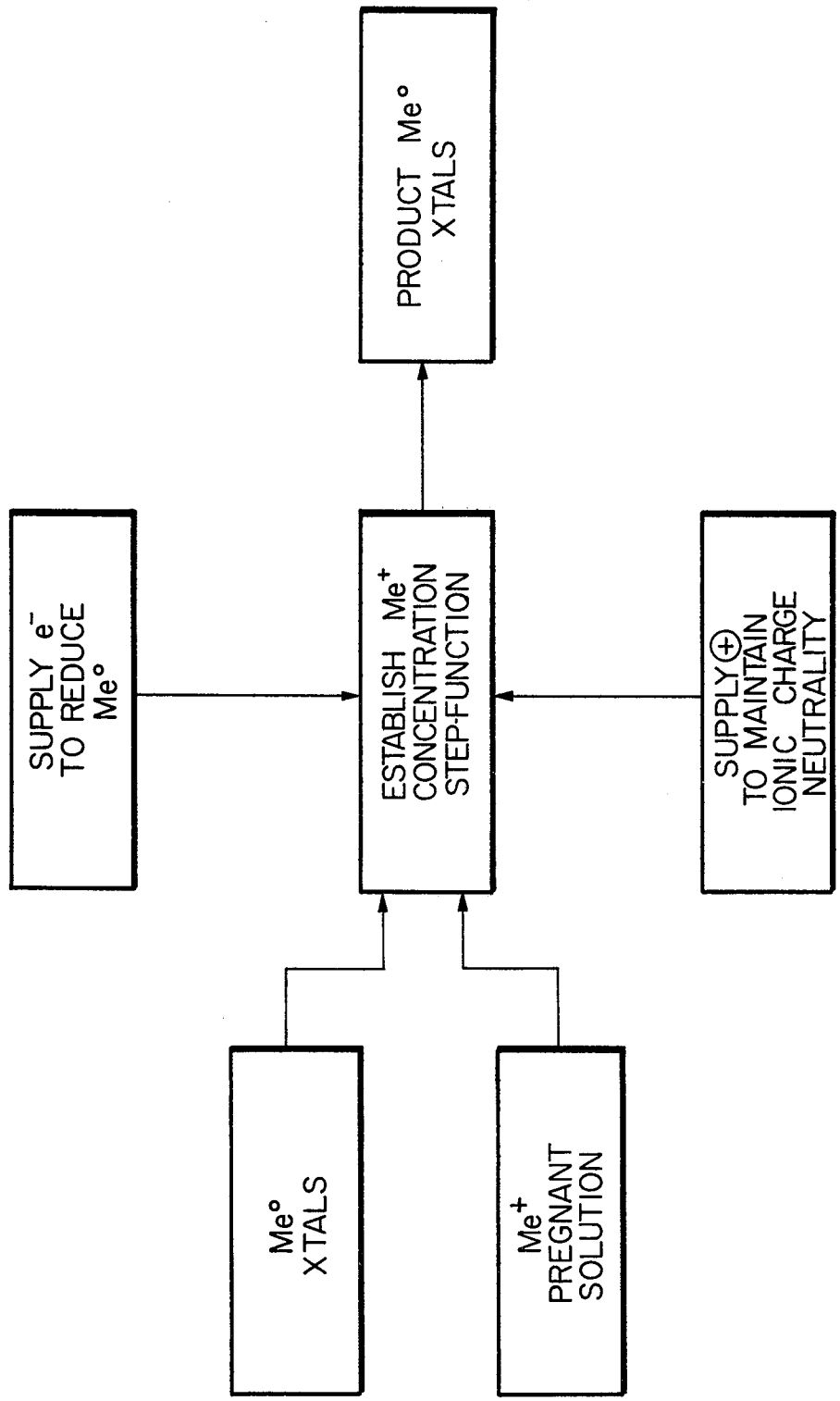

In each of the following examples a solution of a compound of the product metal is prepared. The pregnant solution is then treated in accordance with the general procedure illustrated in my issued U.S. Pat. No. 4,086,082, utilizing similar apparatus. The product metal compound (MeX) is contacted with the indicated reagent metal. The particular techniques employed to prepare the pregnant solution or other process details are indicated in the accompanying notes.

TABLE 1

| | | Examples 1-9 | | |
|---|---|---|---|---|
| Example | Product Metal Crystal | Product Metal Compound | Reagent Metal | Notes |
| 1 | Sn | SnCl$_2$ | Zn | SnCl$_2$ is dissolved in H$_2$O to 50 g/l Sn content; pH 1; free acid adjusted to less than 1 g/l. |
| 2 | Sn | SnSO$_4$ | Fe | SnSO$_4$ is dissolved in H$_2$O to 50 g/l Sn content at pH=1.5 to prevent Sn ppt. |
| 3 | Ag | AgNO$_3$ | Cu | AgNO$_3$ is dissolved in cold H$_2$O to 3100 g/l Ag content. |
| 4 | Ag | AgCl | Zn | AgCl is dissolved in conc. Na$_2$S$_2$O$_3$ and diluted w/H$_2$O to 50 g/l Ag content. |
| 5 | Ta | TaF$_5$ | Al | Tantalum fluoride is dissolved in ethyl alcohol to 50 g/l Ta content. |
| 6 | Ta | TaCl$_5$ | Mg | TaCl$_5$ is dissolved in ethyl alc to |

TABLE 1-continued

| | | Examples 1-9 | | |
|---|---|---|---|---|
| Example | Product Metal Crystal | Product Metal Compound | Reagent Metal | Notes |
| 7 | Ni | NiCl$_2$ | Zn | 50 g/l Ta content. NiCl$_2$ is dissolved in ethyl alcohol to saturation. |
| 8 | As | As$_2$O$_5$ | Fe | As$_2$O$_5$ is dissolved in cold H$_2$O to 50 g/l. |
| 9 | As | AsCl$_3$ | Zn | AsCl$_3$ is dissolved in conc. HCl and diluted w/H$_2$O to 75 g/l As content at pH=4.0 to prevent As ppt. Free acid 1 g/l. |

Having described my invention in such clear and concise terms as to enable those skilled in the art to understand and practice it, and having identified the presently preferred embodiments thereof, I claim:

1. As a new article of manufacture, a metal crystal which is
   (a) macrocrystalline,
   (b) unicrystalline,
   (c) columnar,
   (d) a single prime particle bounded by at least two sets of distinguishable (hkl) planes specific to said metal which are determined by the internal crystal structure, the crystal orientation being such that another (hkl) plane specific to said metal is perpendicular to the long axis of the crystal, said sets of planes defining a plurality of parallel, non-coplanar, macroscopic facets, which microscopically are crystallographic step-growth surfaces.

2. Crystal of claim 1 which is a silver crystal having (100) bounding planes, a (110) plane perpendicular to the long axis of the crystal and a (111) plane is perpendicular to the smallest cross-section thereof.

3. Crystal of claim 1 which is a nickel crystal having (100) bounding planes, a (110) plane perpendicular to the long axis of the crystal and a (111) plane is perpendicular to the smallest cross-section thereof.

4. Crystal of claim 1 which is a tin crystal having (100) bounding planes, a (001) plane perpendicular to the long axis of the crystal and a (110) plane is perpendicular to the smallest cross-section thereof.

5. Crystal of claim 1 which is a tantalum crystal having (110) bounding planes, a (111) plane perpendicular to the long axis of the crystal and a (110) plane is perpendicular to the smallest cross-section thereof.

6. Crystal of claim 1 which is an arsenic crystal having (100) bounding planes, a (110) plane perpendicular to the long axis of the crystal and a (111) plane is perpendicular to the smallest cross-section thereof.

7. A process for producing a product metal from a solution of values thereof, comprising:
   (a) providing in a crystallization zone
      (i) a pregnant solution of values of said product metal, and
      (ii) crystals of said product metal;
   (b) supplying electrons to said crystals to preferentially reduce product metal ions to product metal in a reduction zone adjacent said crystals;
   (c) supplying positive ions in a region of said crystallization zone remote from reduction zone to maintain ionic charge neutrality in said solution;
   (d) establishing a concentration step-function of said metal values in said crystallization zone in the locus of said crystals, the gradient thereof being at least sufficient to cause said product metal to attach to the crystal lattice of said crystals by atomic bonding; and
   (e) maintaining the concentration step-function of step (d) for a time sufficient to produce a macrocrystalline, unicrystalline, columnar product.

* * * * *